(12) United States Patent
Onishi et al.

(10) Patent No.: US 8,773,831 B2
(45) Date of Patent: Jul. 8, 2014

(54) SEMICONDUCTOR INTEGRATED CIRCUIT

(75) Inventors: Akinobu Onishi, Ota (JP); Yasuhiro Hinokuma, Ora-gun (JP); Kazuyuki Kobayashi, Ora-gun (JP); Kengo Murase, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 80 days.

(21) Appl. No.: 13/495,797

(22) Filed: Jun. 13, 2012

(65) Prior Publication Data

US 2012/0320482 A1 Dec. 20, 2012

(30) Foreign Application Priority Data

Jun. 15, 2011 (JP) ................. 2011-133115

(51) Int. Cl.
*H02H 3/20* (2006.01)

(52) U.S. Cl.
USPC ......................................... 361/91.1; 330/298

(58) Field of Classification Search
USPC .............. 330/252–261, 310–311, 298, 207 P
See application file for complete search history.

(56) References Cited

U.S. PATENT DOCUMENTS

| 6,483,386 | B1 | 11/2002 | Cress et al. |
| 7,071,785 | B2 * | 7/2006 | Behzad ........................ 330/311 |
| 7,129,871 | B1 | 10/2006 | Venes et al. |
| 7,301,401 | B2 * | 11/2007 | Pennock ....................... 330/277 |
| 2006/0109055 | A1 | 5/2006 | Pennock |
| 2006/0119430 | A1 | 6/2006 | Poulton |
| 2009/0251214 | A1 | 10/2009 | Shkidt et al. |

FOREIGN PATENT DOCUMENTS

JP 2009-225083 10/2009

OTHER PUBLICATIONS

Search Report dated Nov. 29, 2012, directed to EP Application No. 12171149.3; 6 pages.

* cited by examiner

*Primary Examiner* — Hieu Nguyen
(74) *Attorney, Agent, or Firm* — Noon Intellectual Property Law, P.C.

(57) ABSTRACT

A semiconductor integrated circuit that is efficiently reduced in a noise level is offered. P-channel type MOS transistors M1 and M2 serving as differential input transistors have a thin gate oxide film in order to reduce the noise level. A protection circuit to protect the P-channel type MOS transistors M1 and M2 from overvoltage is formed including P-channel type MOS transistors M3 and M4. The P-channel type MOS transistor M3 is a first protection transistor to protect the P-channel type MOS transistor M1 from overvoltage, and is connected to a drain of the P-channel type MOS transistor M1. The P-channel type MOS transistor M4 is a second protection transistor to protect the P-channel type MOS transistor M2 from overvoltage, and is connected to a drain of the P-channel type MOS transistor M2.

20 Claims, 9 Drawing Sheets

SEMICONDUCTOR INTEGRATED CIRCUIT

CROSS-REFERENCE OF THE INVENTION

This application claims priority from Japanese Patent Application No. 2011-133115, the content of which is incorporated herein by reference in its entirety.

BACKGROUND OF THE INVENTION

1. Field of the Invention

This invention relates to a semiconductor integrated circuit, specifically to a semiconductor integrated circuit that is reduced in a noise level.

2. Description of the Related Art

Higher speed and higher integration of a digital circuit have been realized as semiconductor manufacturing processes proceed to finer geometries. As a result, reducing a die size, reducing a cost per function due to the increased integration, and integrating a large scale system into a single chip are made possible. On the other hand, an analog circuit needs to be formed using transistors having certain dimensions of a gate width and a gate length in order to keep required signal quality even when the manufacturing processes have attained the finer geometries.

Also, the analog circuit is prone to reduction in a dynamic range and limitation on choices of circuit topologies due to a reduced power supply voltage associated with the finer geometries. Nevertheless, increasing performance of the analog circuit is essential in developing an analog-digital mixed LSI.

FIG. 8 is a circuit diagram of an operational amplifier that is an example of the analog circuit. The operational amplifier is of a P-channel type MOS transistor input type and is structured to have a single-ended output. P-channel type MOS transistors M61, M62 and M65 and N-channel type MOS transistors M63 and M64 constitute a first stage differential amplifier circuit 11. Each of differential input voltages VINN and VINP is applied to a gate of corresponding each of the transistors M61 and M62 that serve as differential input transistors. A P-channel type MOS transistor M66 and an N-channel type MOS transistor M67 constitute a second stage amplifier circuit 12, and an output voltage VOUT is obtained from a connecting node between them.

A phase compensation circuit 3 composed of a resistor RZ for zero cancellation and a capacitor CC for phase compensation, which are connected with each other in series, is connected between the first stage differential amplifier circuit 11 and the second stage amplifier circuit 12 so that the operational amplifier is prevented from oscillation.

A bias circuit 4 is composed of P-channel type MOS transistors M51, M53, M55 and M57, N-channel type MOS transistors M52, M54, M56 and M58 and a resistor RB1. When a power down signal PWDB applied to a gate of the N-channel type MOS transistor M52 turns to an H level, the N-channel type MOS transistor M52 is turned on to put the bias circuit 4 into operation. Thus, a bias voltage required for operations of the operational amplifier is supplied to a gate of the P-channel type MOS transistor M65 that serves as a current source transistor of the first stage differential amplifier circuit 11 and a gate of the P-channel type MOS transistor M66 that serves as a load transistor of the second stage amplifier circuit 12. This kind of operational amplifier is disclosed in Japanese Patent Application Publication No. 2009-225083.

A signal level (a level of each of the differential input voltages VINN and VINP, for example) that is workable with the operational amplifier is reduced as a power supply voltage VDDH supplied to the operational amplifier is reduced. When the signal level is reduced, there is caused a reduction in SNR (Signal to Noise Ratio) that is one of essential characteristics of the analog circuit. It is necessary to reduce a noise level of the operational amplifier itself so that the performance of the operational amplifier is enhanced even when the signal level is reduced.

FIG. 9 shows noise characteristics of a MOS transistor. The noise of the MOS transistor is primarily made of flicker noise distributed in a low frequency band and thermal noise distributed over a broad band. The SNR can be improved by reducing the flicker noise and the thermal noise that approximately determine the noise of an overall circuit composed of the MOS transistors.

First, the flicker noise, that is one of noise sources of the MOS transistor, is explained.

Flicker noise power $Vnf^2$ per unit band width is given by a following equation (1).

$$Vnf^2 = K/(Cox \times W \times L) \times (1/f) \quad (1)$$

where K is a constant dependent on the manufacturing processes, Cox is a gate oxide film capacitance per unit area, W is a gate width of the MOS transistor, L is a gate length of the MOS transistor, and f is an operating frequency of the MOS transistor.

The flicker noise is characterized by that it increases as the frequency decreases and decreases as the frequency increases. Particularly in the frequency band dealing with voice signals and audio signals, the flicker noise often makes dominant noise and reducing it is essential. The flicker noise can be reduced by increasing a gate area of the MOS transistor because it is inversely proportional to the gate width and the gate length of the MOS transistor.

Next, the thermal noise, that is another of the noise sources of the MOS transistor, is explained. In the case where the input signal applied to the gate is amplified (most of the cases), the thermal noise $Vnin^2$ per unit band width is given by a following equation (2).

$$Vnin^2 = (8 \times k \times T)/(3 \times gm) \quad (2)$$

where k is Boltzmann's constant, T is temperature in Kelvin, and gm is transconductance of the MOS transistor. The transconductance gm of the MOS transistor is given by a following equation (3).

$$gm = \sqrt{(2 \times \mu \times Cox \times (W/L) \times Id)} \quad (3)$$

where μ is mobility of the MOS transistor, Cox is the gate oxide film capacitance per unit area, W is the gate width of the MOS transistor, L is the gate length of the MOS transistor, and Id is a drain current of the MOS transistor.

The thermal noise is uniformly distributed from low frequency to high frequency. Reducing a level of the thermal noise is essential since it makes dominant noise in signal dealing with relatively high frequency or in a discrete system (sampling data system). The thermal noise can be reduced by increasing the transconductance of the MOS transistor because it is inversely proportional to the transconductance.

Taking the operational amplifier shown in FIG. 8 as an example, it is generally known that the flicker noise occupies major portion of noise with the P-channel type MOS transistors M61 and M62 and the N-channel type MOS transistors M63 and M64 in the overall circuit. Although reducing the flicker noise requires increasing the gate area of each of the MOS transistors, simply increasing the gate area results in an increased die size. Also, increasing the sizes of the transistors affects adjacent parasitic capacitances and possibly increases current consumption.

Chopper modulation technique is known as a method to reduce the flicker noise without increasing the area of the transistor. The chopper modulation technique is a method to modulate low frequency noise to higher frequency side with a modulation clock. However, this method requires a clock generation circuit to generate the modulation clock, a switch control circuit, a switching circuit and the like, so that a size of the circuit is prone to increase. In addition, when it is applied to an integrated circuit composed of a plurality of circuits in which the flicker noise is dominant, each of the plurality of circuits requires the circuits described above, resulting in increased size of the circuit and increased current consumption.

Furthermore, when it is used in a continuous time system, a filter to remove a chopper clock signal is required in a subsequent stage.

Reducing the thermal noise requires increasing the transconductance of the MOS transistor. Taking the operational amplifier shown in FIG. 8 as an example, the P-channel type MOS transistors M61 and M62 are subject to the requirement. The transconductance is increased by increasing a W/L ratio, or by increasing a drain current.

However, the increase in the W/L ratio leads to an increase in the area, and the increase in the drain current leads to an increase in the current consumption. In addition, in the discrete time system (sampling data system), the thermal noise appears in a signal band as a folding noise to increase the noise in the signal band, since the thermal noise is distributed over the broad band. Although a sampling method using a sampling frequency higher than the required signal band is known to reduce the influence of the thermal noise due to the folding, it leads to an increase in the current consumption because the operating frequency is increased.

As the processes proceed to the finer geometries and the power supply voltage is reduced, the dynamic range is inevitably reduced to degrade analog characteristics. Under the circumstances described above, there is caused a problem that it is difficult to maintain or improve the characteristics of the semiconductor integrated circuit such as the operational amplifier without increasing the size (increasing the area) of the circuit or increasing the current consumption.

SUMMARY OF THE INVENTION

This invention offers a semiconductor integrated circuit provided with a circuit formed to include a transistor having a thick gate oxide film and a transistor having a thin gate oxide film, which is configured to operate in a circuit portion in which noise substantially affects its circuit operation, and a protection circuit disposed in the circuit and protecting the transistor having the thin gate oxide film from overvoltage. The thick gate oxide film is thicker than the thin gate oxide film. The circuit is provided with a power supply voltage corresponding to the transistor having the thick gate oxide film.

DETAILED DESCRIPTION OF THE INVENTION

Figure 1:
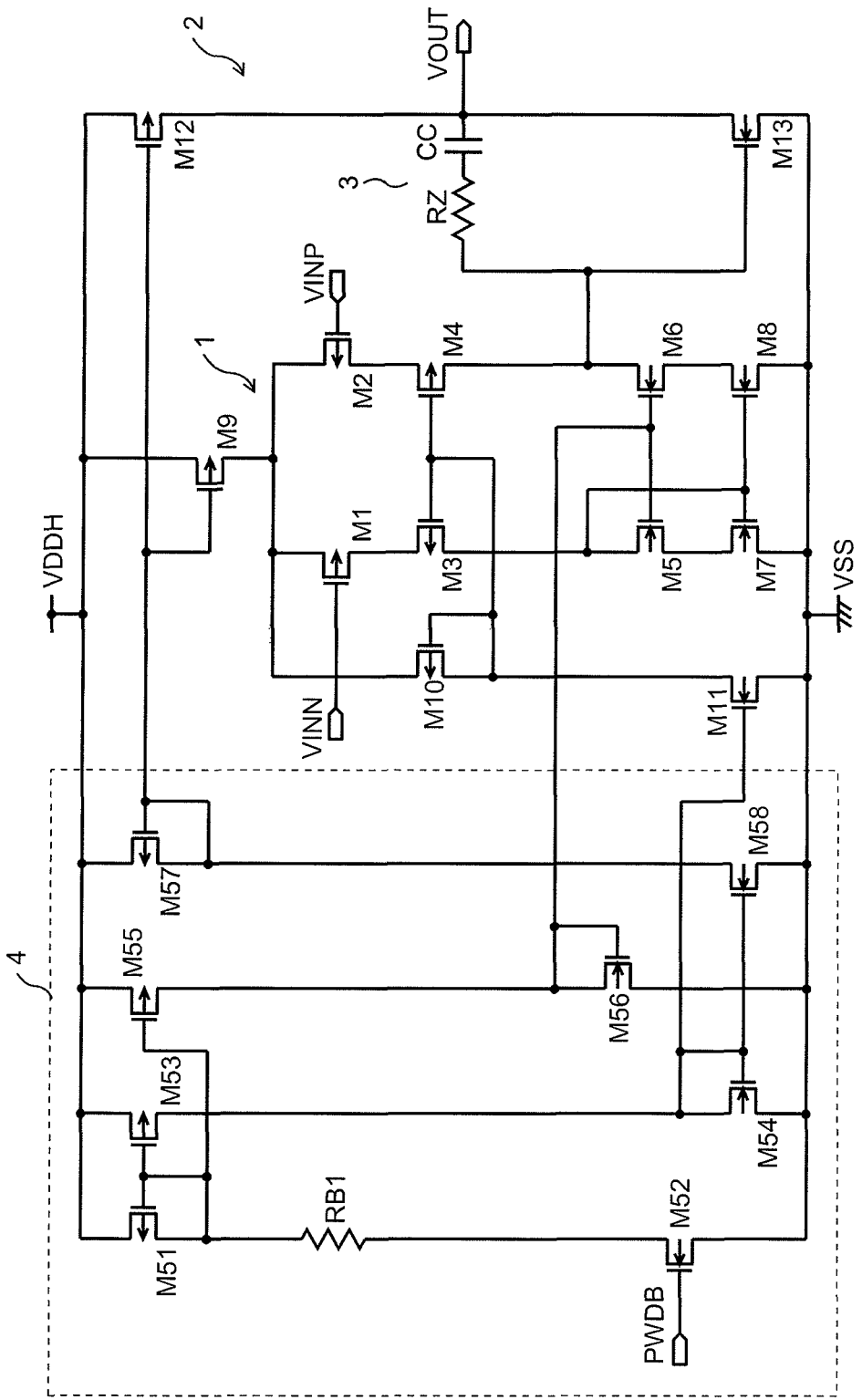
FIG. 1 is a circuit diagram of an operational amplifier according to a first embodiment of this invention.

FIG. 1 is a circuit diagram showing a low noise operational amplifier (an example of a semiconductor integrated circuit) according to the first embodiment of this invention. This operational amplifier is of a P-channel type MOS transistor input type and is structured to have a single-ended output. There are normally provided a MOS transistor having a thick gate oxide film that is often used in an analog circuit and a MOS transistor having a thin gate oxide film that is often used in a digital circuit in a fine geometry process.

In a 0.15 μm process, a thickness of the thick gate oxide film is about 7 nm and a thickness of the thin gate oxide is about 3.5 μm, for example.

A power supply voltage used for the MOS transistor having the thick gate oxide film is referred to as VDDH, while a power supply voltage used for the MOS transistor having the thin gate oxide film is referred to as VDDL. A ground electric potential used for both MOS transistors is referred to as VSS. VDDH>VDDL holds. The operational amplifier is provided with the power supply voltage VDDH that corresponds to the MOS transistor having the thick gate oxide film. VDDH is 3.3V and VDDL is 1.5V, for example.

A first stage differential amplifier circuit 1 is formed of P-channel type MOS transistors M1 and M2 having the thin gate oxide film, N-channel type MOS transistors M7 and M8 having the thin gate oxide film, P-channel type MOS transistors M3, M4 and M9 having the thick gate oxide film and N-channel type MOS transistors M5 and M6 having the thick gate oxide film. The operational amplifier is formed of two kinds of MOS transistors in terms of the gate oxide film thickness, which are the thin gate oxide film and the thick gate oxide film.

Each of differential input voltages VINN and VINP is applied to a gate of corresponding each of the P-channel type MOS transistors M1 and M2 that serve as differential input transistors. The P-channel type MOS transistor M9 is a power supply transistor. The power supply voltage VDDH is applied to its source and its drain is connected to a common source of M1 and M2. The N-channel type MOS transistors M7 and M8 having the thin gate oxide film are current source transistors, and would form a current mirror circuit of the operational amplifier if M5 and M6 are removed.

A protection circuit to protect the MOS transistors having the thin gate oxide film from overvoltage is formed of the P-channel type MOS transistors M3 and M4 and the N-channel type MOS transistors M5 and M6 having the thick gate oxide film. That is, the P-channel type MOS transistor M3 is a first protection transistor to protect the P-channel type MOS transistor M1 from overvoltage. Its source is connected to a drain of the P-channel type MOS transistor M1. The P-channel type MOS transistor M4 is a second protection transistor to protect the P-channel type MOS transistor M2 from overvoltage. Its source is connected to a drain of the P-channel type MOS transistor M2.

The N-channel type MOS transistor M5 is a third protection transistor to protect the N-channel type MOS transistor M7 from overvoltage. The N-channel type MOS transistor M6 is a fourth protection transistor to protect the N-channel type MOS transistor M8 from overvoltage. The N-channel type MOS transistors M5 and M7 are connected in series between the P-channel type MOS transistor M3 and the ground. The N-channel type MOS transistors M6 and M8 are connected in series between the P-channel type MOS transistor M4 and the ground.

Gates of the N-channel type MOS transistors M7 and M8 are connected with each other, and together connected to a drain of the N-channel type MOS transistor M5. Sources of the N-channel type MOS transistors M7 and M8 are grounded.

A second stage amplifier circuit 2 is formed of a P-channel type MOS transistor M12 (a load transistor) having the thick gate oxide film and an N-channel type MOS transistor M13 (an output transistor) having the thick gate oxide film. It is preferable that a resistor RZ for zero cancellation and a capacitor CC for phase compensation are connected between the first stage differential amplifier circuit 1 and the second stage amplifier circuit 2 in order to prevent oscillation.

A bias circuit 4 supplies bias voltages required for the operational amplifier to operate, and is formed of P-channel type MOS transistors M10, M51, M53, M55 and M57 and N-channel type MOS transistors M11, M52, M54, M56 and M58 having the thick gate oxide film and a resistor RB1. When a power down signal PWDB applied to a gate of the N-channel type MOS transistor M52 turns to an H level, the N-channel type MOS transistor M52 is turned on to put the bias circuit 4 into operation.

That is, the bias circuit 4 applies a common first bias voltage to gates of the P-channel type MOS transistors M9 and M12 through the P-channel type MOS transistor M57. The bias circuit 4 also applies a common second bias voltage to gates of the P-channel type MOS transistors M3 and M4 in the protection circuit through the P-channel type MOS transistor M10. The bias circuit 4 also applies a common third bias voltage to gates of the N-channel type MOS transistors M5 and M6 in the protection circuit through the N-channel type MOS transistor M56.

The flicker noise is characterized by that it increases as the frequency decreases and decreases as the frequency increases as described above. Particularly in the frequency band dealing with voice signals and audio signals, the flicker noise often makes dominant noise and reducing it is essential.

In the operational amplifier shown in FIG. 1, transistors through which the flicker noise exerts substantial influence on the circuit are the P-channel type MOS transistors M1 and M2 that are the differential input transistors and the N-channel type MOS transistors M7 and M8 that are the current source transistors.

According to the flicker noise calculation equation (1) described above, the flicker noise power $Vnf^2$ is inversely proportional to the gate oxide film capacitance Cox per unit area as well as to the gate area W×L. The smaller the gate oxide film thickness is, the greater the gate oxide film capacitance Cox is, because the gate oxide film capacitance Cox is inversely proportional to the gate oxide film thickness.

In the case where the MOS transistors M1, M2, M7 and M8 having the thin gate oxide film are used without changing the transistor size (the gate area W×L unchanged), the flicker noise is smaller than that in the case where the MOS transistors having the thick gate oxide film are used, since the gate oxide film capacitance Cox is larger than that in the case where the MOS transistors having the thick gate oxide film are used.

For example, when the thickness of the gate oxide film of the MOS transistor having the thin gate oxide film is half of the thickness of the gate oxide film of the MOS transistor having the thick gate oxide film, the gate oxide film capacitance Cox of the MOS transistor having the thin gate oxide film is twice of that of the MOS transistor having the thick gate oxide film. Therefore, the flicker noise power $Vnf^2$ is halved to reduce the flicker noise by 3 dB (decibels) since Cox in the flicker noise calculation equation (1) is doubled.

On the other hand, realizing the low noise using the MOS transistor having the thick gate oxide film (the W/L ratio being unchanged in order to maintain the characteristics of the transistors) requires making the gate width W and the gate length L of the transistor $\sqrt{2}$ times, respectively, resulting in doubling the gate area. In addition, an area of the surrounding wirings and parasitic capacitances are increased, and the current consumption tends to be increased.

Next, effects on reducing thermal noise in the operational amplifier according to the embodiment will be explained. The thermal noise is uniformly distributed from low frequency to high frequency as described above. Since it makes dominant noise in signal dealing with relatively high frequency or in a discrete system (sampling data system), reducing a level of the thermal noise is essential.

According to the thermal noise calculation equation (2) (applied when the input signal applied to the gate is amplified), reducing the thermal noise requires increasing the transconductance of the MOS transistor. The P-channel type MOS transistors M1 and M2 are subject to the requirement in the operational amplifier shown in FIG. 1. The transconductance is increased by increasing the gate oxide film capacitance per unit area, increasing the W/L ratio, or increasing the drain current.

For example, assuming the mobility μ, the W/L ratio and the drain current of the MOS transistor are unchanged, the transconductance is larger and the thermal noise is smaller because the gate oxide film capacitance is larger in the case where the P-channel type MOS transistors M1 and M2 are formed using the MOS transistors having the thin gate oxide film than in the case where the MOS transistors having the thick gate oxide film are used.

For example, assuming the W/L ratio and the drain current of the transistor are unchanged, when the thickness of the gate oxide film of the MOS transistor having the thin gate oxide film is half of the thickness of the gate oxide film of the MOS transistor having the thick gate oxide film, the gate oxide film capacitance Cox of the MOS transistor having the thin gate oxide film is twice that of the MOS transistor having the thick gate oxide film. Since Cox in the transconductance calculation equation (3) described above is doubled, the transconductance becomes $\sqrt{2}$ times. Therefore, $Vnin^2$ in the thermal noise calculation equation (2) becomes $\sqrt{2}$ times, and the thermal noise is reduced by 1.5 dB.

On the other hand, realizing the low noise using the MOS transistor having the thick gate oxide film requires doubling the gate width of the MOS transistor or doubling the drain current, which requires doubling the gate area, or doubling the current consumption. In addition, when the operational amplifier is used in combination with a differential input circuit of the operational amplifier or the like, it is necessary to double each of the current consumption, resulting in doubling the current consumption of the overall circuit.

Since the power supply voltage of the operational amplifier is the power supply voltage VDDH used corresponding to the MOS transistor having the thick gate oxide film, there is possibility that a drain-source voltage VDS of the P-channel type MOS transistors M1 and M2 and the N-channel type MOS transistor M7 and M8 having the thin gate oxide film would exceed the maximum allowable voltage VDDLMAX for the MOS transistor having the thin gate oxide film. That is, there may be caused destruction or deterioration of the P-channel type MOS transistor M1 or M2 or the N-channel type MOS transistor M7 or M8 having the thin gate oxide film, if nothing is done.

Thus, in the operational amplifier according to the embodiment, the protection circuit composed of the P-channel type MOS transistors M3 and M4 and the protection circuit composed of the N-channel type MOS transistors M5 and M6 are added so that an overvoltage (a voltage exceeding the maximum voltage VDDLMAX) is not applied to drain side of each of the MOS transistors M1, M2, M7 and M8, and that the drain-source voltage of each of the P-channel type MOS transistors M1 and M2 and the N-channel type MOS transistors M7 and M8 having the thin gate oxide film is maintained at an appropriate voltage lower than the maximum voltage VDDLMAX in the operating state. Also, the second and third bias voltages from the bias circuit 4 are set so as to maintain a gate-source voltage of the P-channel type MOS transistors M1 and M2 and the N-channel type MOS transistors M7 and M8 having the thin gate oxide film at an appropriate voltage lower than the maximum voltage VDDLMAX in the operating state.

Figure 2:
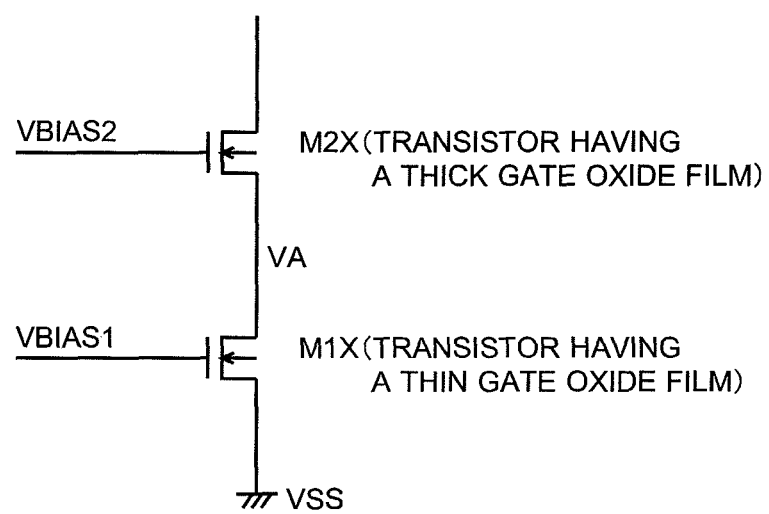
FIG. 2 is a circuit diagram showing an example structure of a protection circuit.

FIG. 2 shows an example of the protection circuit using N-channel type MOS transistors, which can be applied as M5 and M7 in the operational amplifier shown in FIG. 1.

An N-channel type MOS transistor M1X having the thin gate oxide film and an N-channel type MOS transistor M2X having the thick gate oxide film are connected in series. That is, a drain of M1X is connected with a source of M2X. A source of M1X is at the ground electric potential (VSS). An electric potential at a gate of M1X is referred to as VBIAS1, and an electric potential at a gate of M2X is referred to as VBIAS2.

A gate-source voltage of the N-channel type MOS transistor M1X having the thin gate oxide film is referred to as VGSM1, a drain-source voltage of M1X is referred to as VDSM1, a gate-source voltage of the N-channel type MOS transistor MX2 having the thick gate oxide film is referred to as VGSM2, a drain-source voltage of MX2 is referred to as VDSM2, and an electric potential at a connecting node between M1X and M2X is referred to as VA, for example.

It is desirable that VGSM1 and VDSM1 in the operating state are set at predetermined voltages not exceeding the maximum allowable voltage VDDLMAS; since M1X is the MOS transistor having the thin gate oxide film. Thus, the voltages are set as described below.

$VGSM1 = VBIAS1 = $ threshold voltage of $M1X + $ overdrive voltage of $M1X \leq VDDLMAX$ $VDSM1 = VA = $ overdrive voltage of $M1X + \alpha \leq VDDLMAX$ VGSM2=VBIAS2−VA is set so that VA does not exceed VDDMAX. Each of the voltages is set so as not to exceed VDDMAX in the operating state by setting as described above.

It is preferable that a back gate of each of the P-channel type MOS transistors M1 and M2 having the thin gate oxide film shown in FIG. 1 is connected to a source of corresponding each of M1 and M2, for example. By doing so, when an overvoltage exceeding VDDLMAX is applied to the gate, there are obtained effects that M1 and M2 are efficiently protected from the overvoltage and that the operating voltage (center voltage) of the circuit is not limited within a range of the power supply voltage VDDH used by the MOS transistor having the thick gate oxide film. The back gate may be set at the power supply voltage VDDH in the case where the electric potential is set so that the overvoltage exceeding VDDLMAX is not applied to the gate. In the case where M1 and M2 are formed of N-channel type MOS transistors, it is preferable by the same reason that the back gate of each of M1 and M2 is connected to the source of corresponding each of M1 and M2. Same applies to each of embodiments to be described below.

Figure 3:
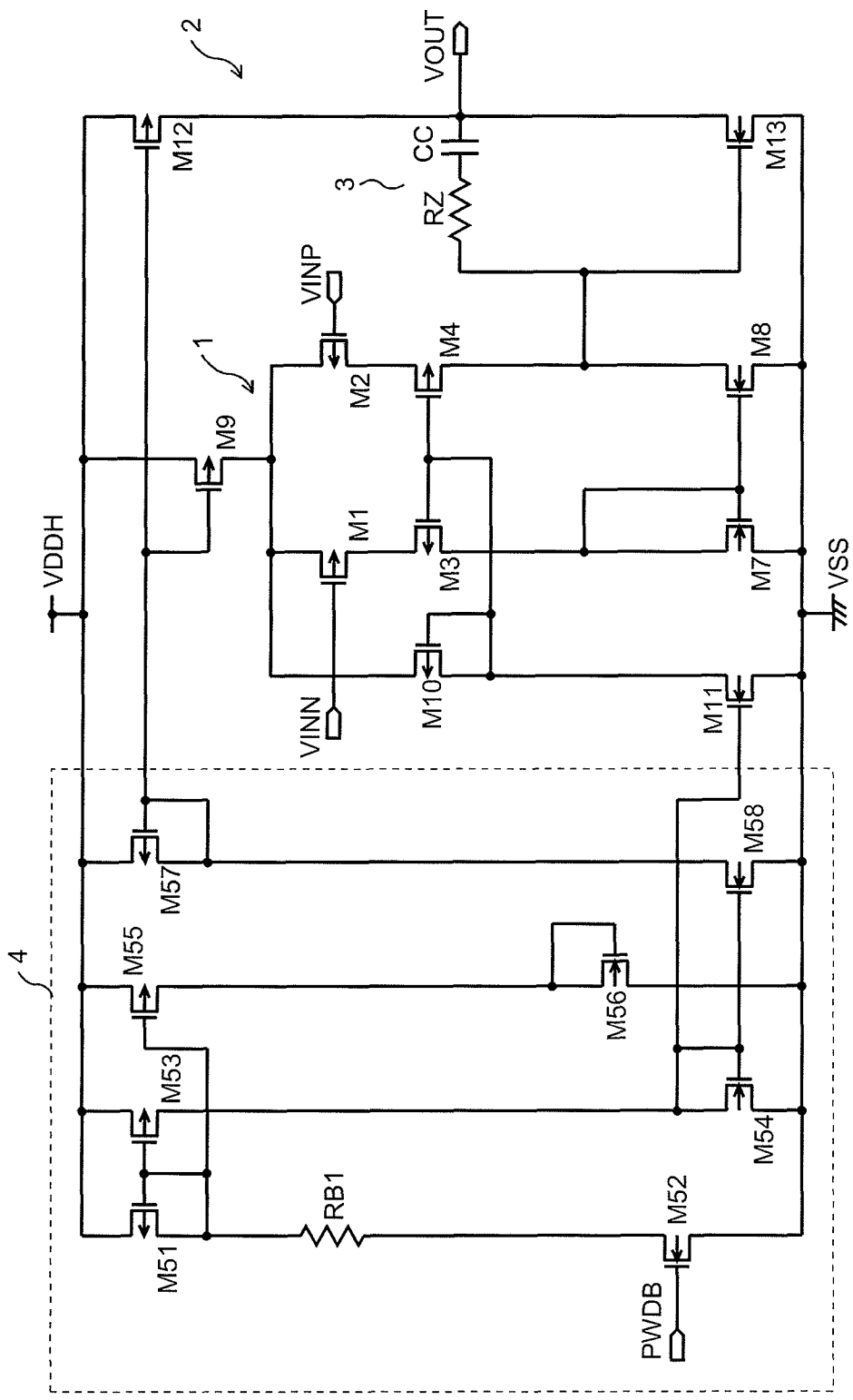
FIG. 3 is a circuit diagram of an operational amplifier according to a second embodiment of this invention.

FIG. 3 is a circuit diagram showing a low noise operational amplifier according to the second embodiment of this invention. In the operational amplifier according to the second embodiment, a first stage differential amplifier circuit 1 is formed of the P-channel type MOS transistors M1 and M2 having the thin gate oxide film, the N-channel type MOS transistors M7 and M8 having the thin gate oxide film, and the P-channel type MOS transistors M3, M4 and M9 having the thick gate oxide film, as in the operational amplifier according to the first embodiment. The operational amplifier according to the second embodiment differs from the operational amplifier according to the first embodiment in that the N-channel type MOS transistors M5 and M6 serving as the protection transistors are not provided in the protection circuit.

Since the N-channel type MOS transistors M7 and M8 having the thin gate oxide film form a current mirror circuit, a drain voltage of each of them becomes equal to a gate voltage of M7. When the gate voltage of M7 is set to a voltage not exceeding VDDLMAX, for example, the drain voltage of M8 becomes equal to the gate voltage of M7 in the operating state, and an excessive voltage is never applied to the drain of M7 or M8 even without the protection circuit.

Figure 4:
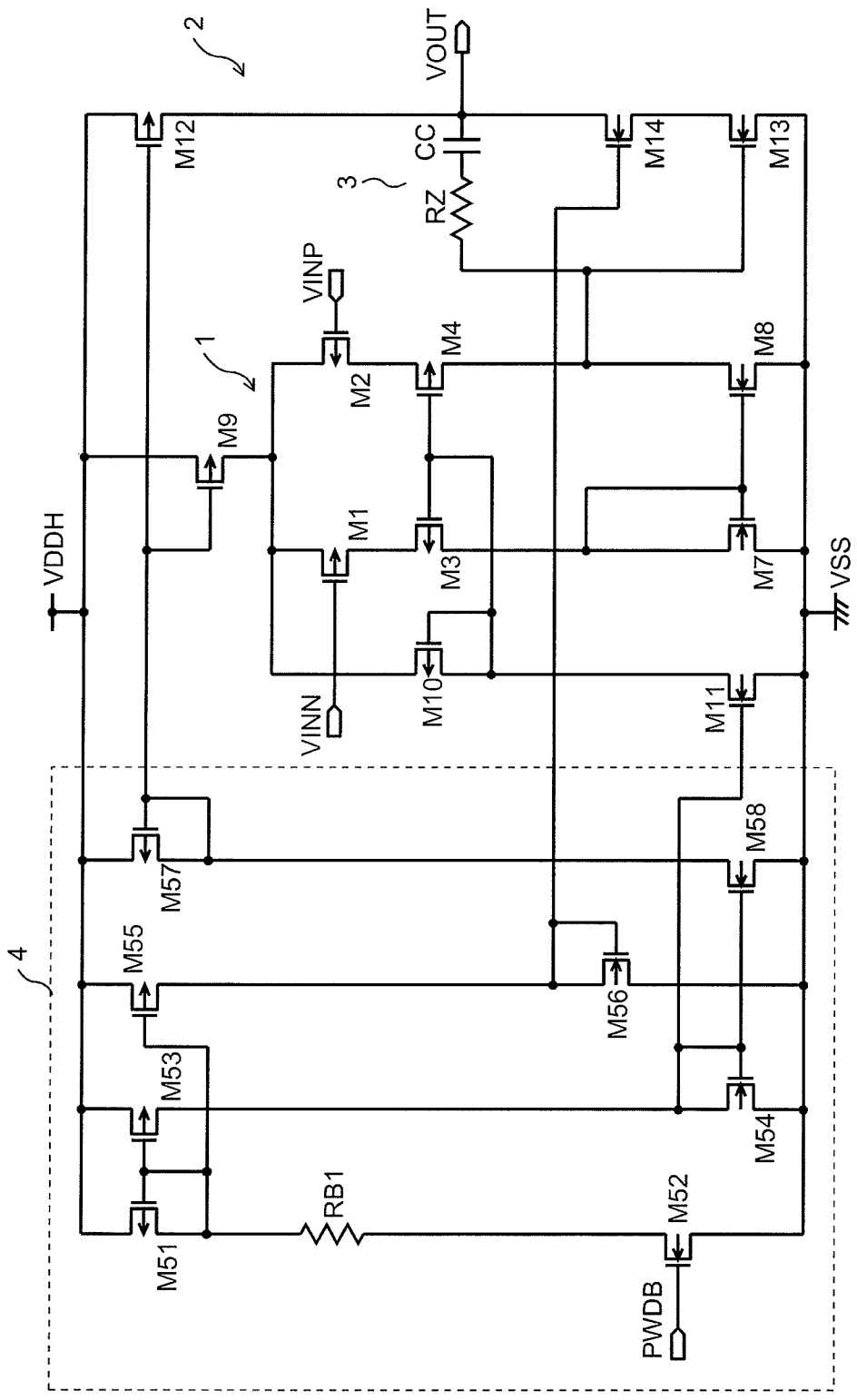
FIG. 4 is a circuit diagram of an operational amplifier according to a third embodiment of this invention.

FIG. 4 is a circuit diagram showing a low noise operational amplifier according to the third embodiment of this invention. The N-channel type MOS transistors M5 and M6 serving as the protection transistors are not provided in the operational amplifier according to the third embodiment as in the operational amplifier according to the second embodiment. The operational amplifier according to the third embodiment differs from the operational amplifier according to the second embodiment in that the N-channel type MOS transistor M13 serving as the output transistor of the second stage amplifier circuit 2 is formed of a MOS transistor having the thin gate oxide film and its drain is connected in series with an N-channel type MOS transistor M14 having the thick gate oxide film.

The N-channel type MOS transistor M14 is a protection transistor to protect the N-channel type MOS transistor M13 from overvoltage, and the third bias voltage from the bias circuit 4 is applied to its gate.

Since the operational amplifier uses the MOS transistors having the thin gate oxide film throughout a signal path from the input to the output, it can reduce the noise level while high speed operation is realized.

Although the second stage amplifier circuit 2 in the operational amplifier according to the third embodiment is structured to have the single-ended output that outputs a single output voltage VOUT, it may be structured to have a differential output that outputs a pair of differential output voltages. In this case, a circuit structured in the same way as the circuit formed of M12, M13 and M14 is disposed symmetrically with respect to the first stage differential amplifier circuit 1.

Figure 5:
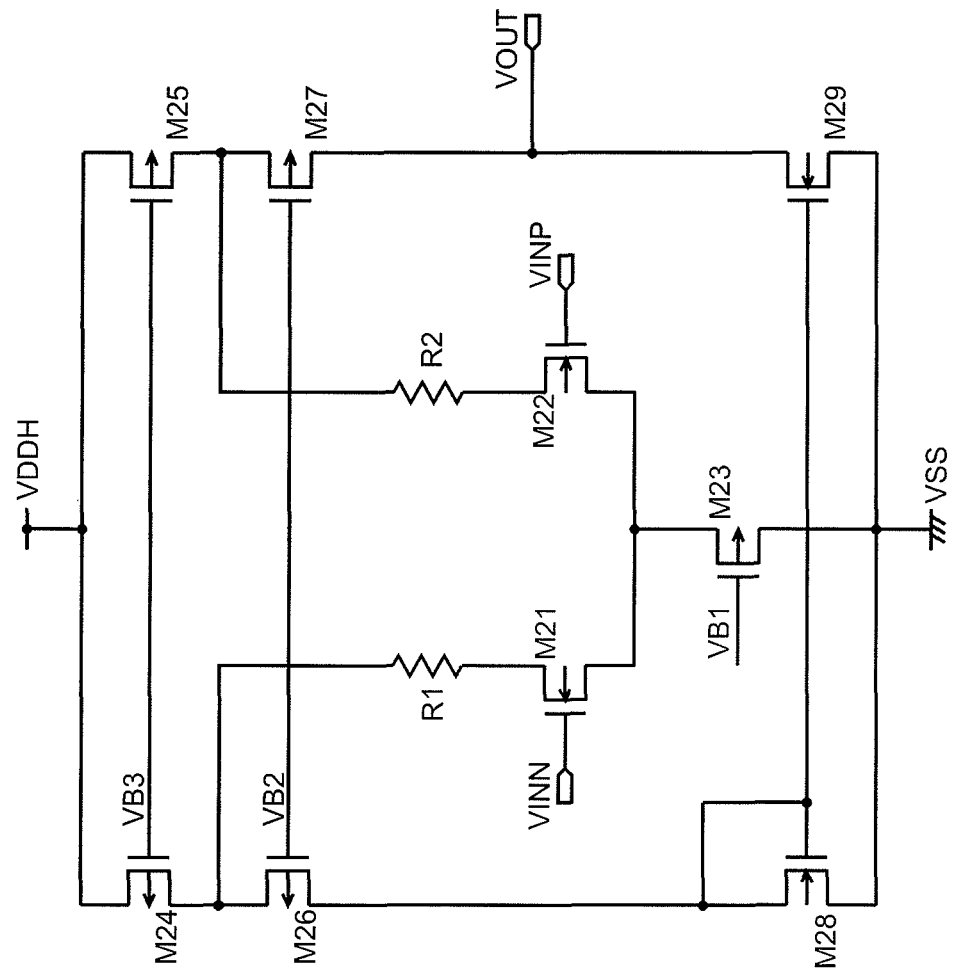
FIG. 5 is a circuit diagram of an operational amplifier according to a fourth embodiment of this invention.

FIG. 5 is a circuit diagram showing a low noise operational amplifier according to the fourth embodiment of this invention. The operational amplifier according to the fourth embodiment is formed to include P-channel type MOS transistors M24, M25, M26 and M27 having the thick gate oxide film, N-channel type MOS transistors M21 and M22 having the thin gate oxide film, N-channel type MOS transistors M23, M28 and M29 having the thick gate oxide film, a first protection resistor R1 and a second protection resistor R2. The power supply voltage VDDH corresponding to the MOS transistor having the thick gate oxide film is applied to sources of the P-channel type MOS transistors M24 and M25.

A common bias voltage VB2 is applied to gates of M26 and M27, while a common bias voltage VB3 is applied to gates of M24 and M25. Sources of M28 and M29 that form a current mirror circuit are grounded. M23 is a current source transistor, and is connected between the ground and sources of M21 and M22, which are connected with each other. A bias voltage VB1 is applied to its gate. The output voltage VOUT is obtained from a connecting node between M27 and M29.

The N-channel type MOS transistors M21 and M22 are differential input transistors. The differential input voltage VINN is applied to a gate of M21 while the differential input voltage VINP is applied to a gate of M22.

A protection circuit of the N-channel type MOS transistors M21 and M22 is formed of the first protection resistor R1 and the second protection resistor R2. The first protection resistor R1 is connected between a drain of M21 and a connecting node between M24 and M26, and protects M21 from overvoltage as the protection transistor in the operational amplifier according to the first embodiment. That is, the source-drain voltage applied to M21 is reduced by providing the first protection resistor R1. The second protection resistor R2 is connected between a drain of M22 and a connecting node between M25 and M27, and protects M22 from overvoltage similarly.

Similar to the first embodiment, it is preferable that the back gate of each of M21 and M22 having the thin gate oxide film is connected to the source of corresponding each of them, so that M21 and M22 are protected more efficiently from overvoltage when the overvoltage exceeding VDDLMAX is applied to their gates.

Figure 6:
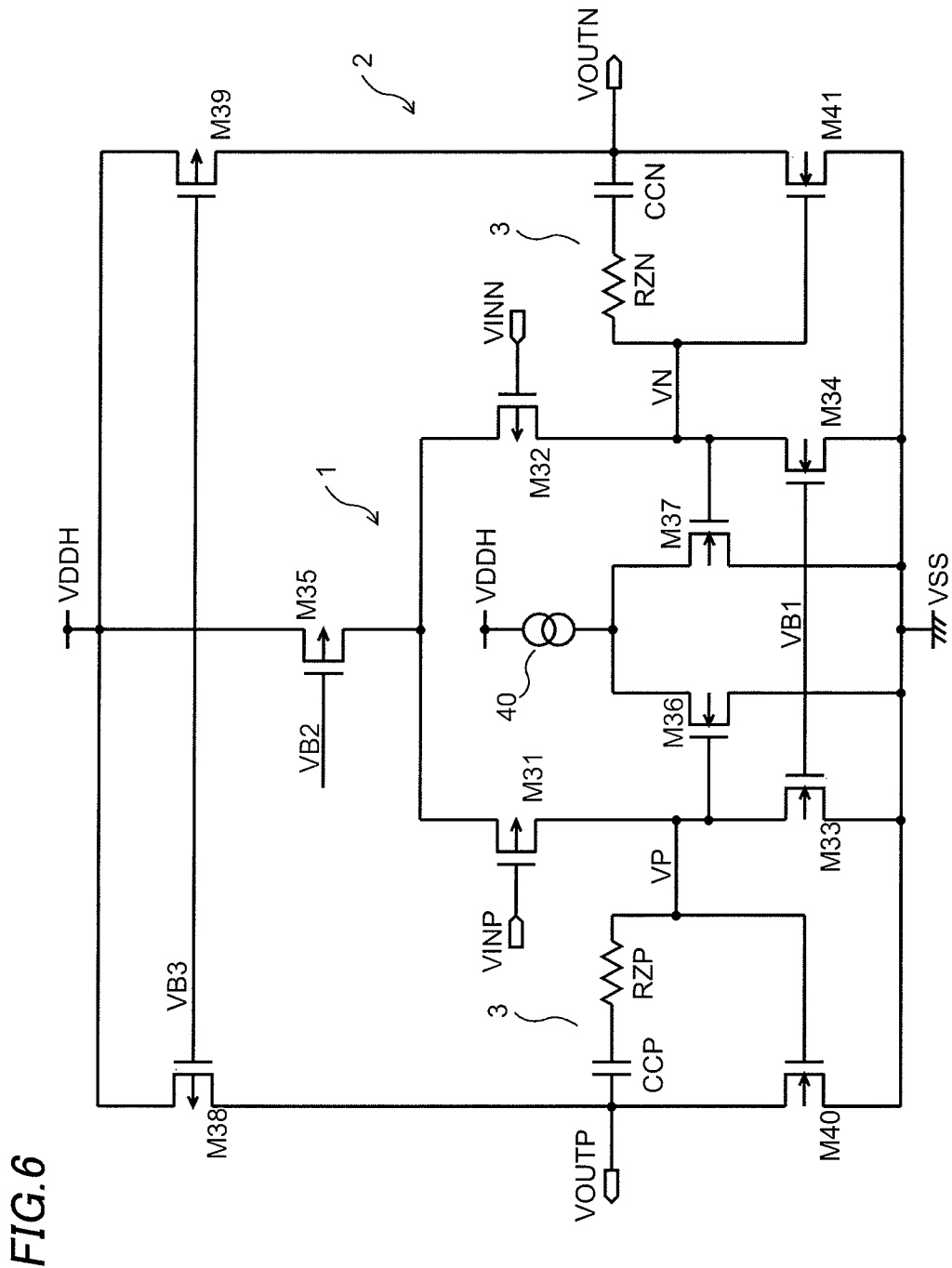
FIG. 6 is a circuit diagram of an operational amplifier according to a fifth embodiment of this invention.

FIG. 6 is a circuit diagram showing a low noise operational amplifier according to the fifth embodiment of this invention. The operational amplifier is a completely differential type operational amplifier that outputs a pair of differential output voltages VOUTP and VOUTN, and is formed to include P-channel type MOS transistors M31, M32, M35, M38 and M39 having the thick gate oxide film, N-channel type MOS transistors M33 and M34 having the thin gate oxide film, N-channel type MOS transistors M40 and M41 having the thick gate oxide film, and a protection circuit composed of resistors RZP and RZN for zero cancellation, capacitors CCP and CCN for phase compensation, a constant current source 40 and N-channel type MOS transistors M36 and M37. The power supply voltage VDDH corresponding to the MOS transistor having the thick gate oxide film is applied to sources of the P-channel type MOS transistors M35, M38 and M39. Sources of the N-channel type MOS transistors M40, M41, M33 and M34 are grounded.

The P-channel type MOS transistors M31, M32 and M35 and the N-channel type MOS transistors M33 and M34 constitute a first stage differential amplifier circuit 1. The P-channel type MOS transistors M31 and M32 are differential input transistors. The differential input voltage VINP is applied to a gate of M31 while the differential input voltage VINN is applied to a gate of M32. The N-channel type MOS transistors M33 and M34 are current source transistors. A common bias voltage VB1 is applied to their gates.

The constant current source 40 and the N-channel type MOS transistors M36 and M37 constitute the protection circuit of the N-channel type transistors M33 and M34. The N-channel type MOS transistor M36 having a drain connected to the constant current source 40 and a gate connected to a connecting node between the P-channel type MOS transistor 31 and the N-channel type MOS transistor M33 protects the N-channel type MOS transistor M33 from overvoltage. The N-channel type MOS transistor M37 having a drain connected to the constant current source 40 and a gate connected to a connecting node between the P-channel type MOS transistor 32 and the N-channel type MOS transistor M34 protects the N-channel type MOS transistor M34 from overvoltage.

It is preferable that the N-channel type MOS transistors M36 and M37 forming the protection circuit are transistors having the thick gate oxide film. In the case where the N-channel type MOS transistors M36 and M37 are transistors having the thin gate oxide film, there is required an additional protection circuit for the N-channel type MOS transistors M36 and M37.

Gate voltages of M36 and M37 are determined by a current supplied from the constant current source 40 to each of the transistors and sizes of the transistors, and can be set so that the gate voltages do not exceed VDDLMAX by setting the current supplied to M36 and M37 and the sizes of M36 and M37 appropriately. A drain voltage of each of M33 and M34 is equal to the gate voltage of corresponding each of M36 and M37 in the operating state, and the transistors are protected from overvoltage.

The P-channel type MOS transistors M38 and M39 and the N-channel type MOS transistors M40 and M41 constitute a second stage amplifier circuit 2. A differential output voltage VP from the first stage differential amplifier circuit 1 is applied to a gate of M40, while another differential output voltage VN is applied to a gate of M41. The differential output voltage VOUTP is outputted from a connecting node between M40 and M38, while another differential output voltage VOUTN is outputted from a connecting node between M41 and M39. It is preferable that a phase compensation circuit 3 composed of the resistor RZP or RZN for zero cancellation and the capacitor CCP or CCN for phase compensation is connected between the first stage differential amplifier circuit 1 and the second stage amplifier circuit 2 in order to prevent oscillation of the operational amplifier.

Figure 7:
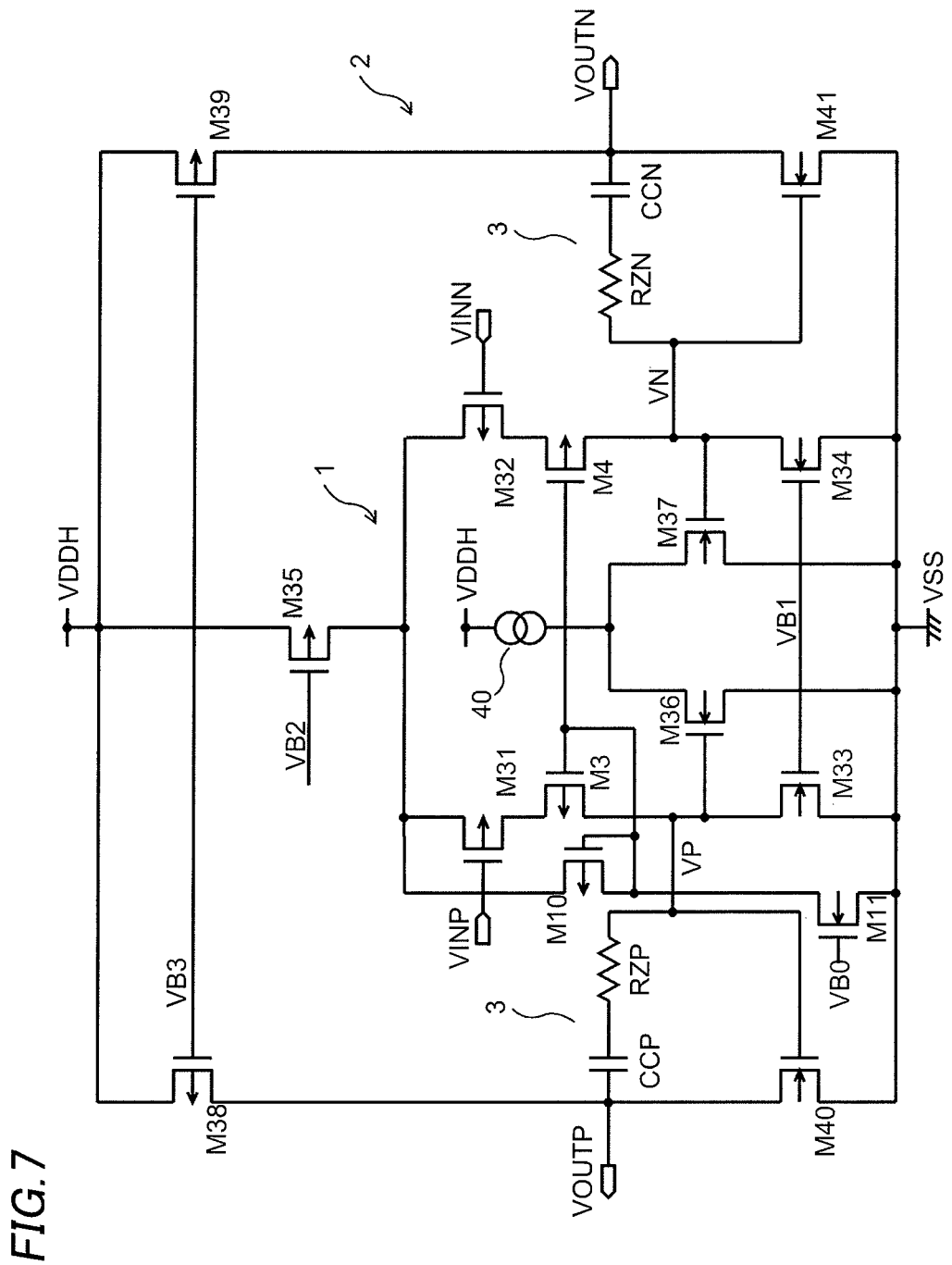
FIG. 7 is a circuit diagram of another operational amplifier according to the fifth embodiment of this invention.
Figure 8:
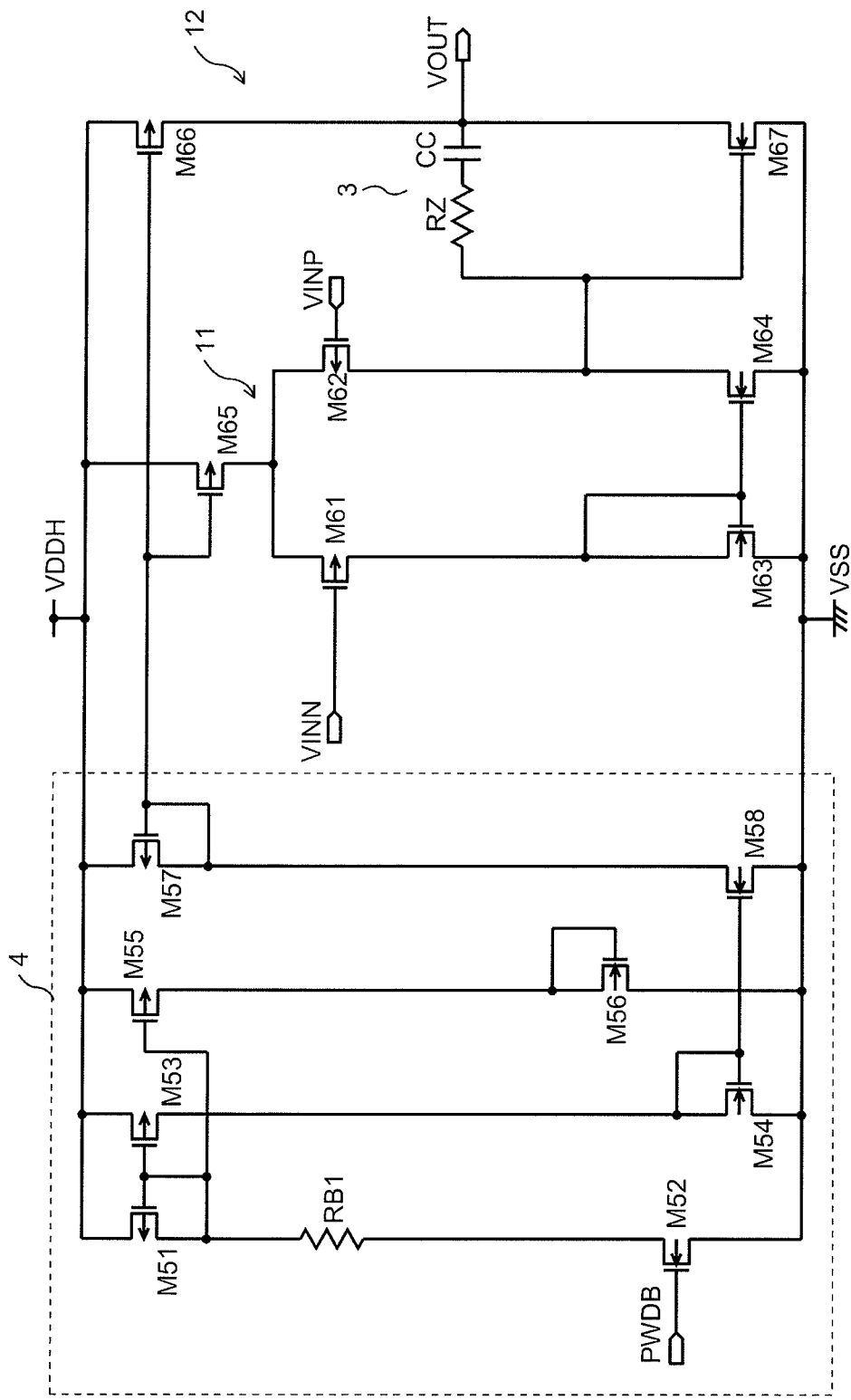
FIG. 8 is a circuit diagram of a conventional operational amplifier.
Figure 9:
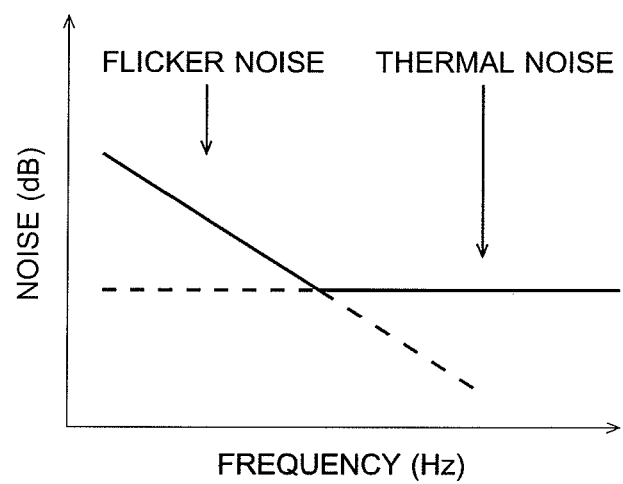
FIG. 9 shows noise characteristics of a MOS transistor.

FIG. 7 shows another operational amplifier according to the fifth embodiment. It is formed by adding the P-channel type MOS transistors M3, M4 and M10 and the N-channel MOS transistor M11 in the operational amplifier according to the first embodiment to the operational amplifier shown in FIG. 6. That is, the P-channel type MOS transistor M3 is the first protection transistor to protect the P-channel type MOS transistor M31 from overvoltage. The P-channel type MOS transistor M4 is the second protection transistor to protect the P-channel type MOS transistor M32 from overvoltage.

In this case, the P-channel type MOS transistors M31 and M32 that are the differential input transistors have the thin gate oxide film. The gate of the N-channel type MOS transistor M36 is connected to a connecting node between the P-channel type MOS transistor M3 and the N-channel type MOS transistor M33. Similarly, the gate of the N-channel type MOS transistor M37 is connected to a connecting node between the P-channel type MOS transistor M4 and the N-channel type MOS transistor M34.

As described above, in the circuit structured including the MOS transistors having the thick gate oxide film, the noise level can be efficiently reduced by using the MOS transistors having the thin gate oxide film in the circuit portion in which the circuit operation is substantially affected by the noise. Also, even when the power supply voltage is the power supply voltage VDDH used for the MOS transistors having the thick gate oxide film, the circuit can operate without applying the excessive voltage to the MOS transistors having the thin gate oxide film by adding the protection circuit. In addition, by the use of the power supply voltage VDDH, which is higher than the power supply voltage VDDL corresponding to the MOS transistors having the thin gate oxide film, reduction in a workable level of the signal can be suppressed to the minimum so that the high performance can be realized.

Also, substantial increase in the circuits for the chopper modulation and extreme increase in the area for the noise reduction can be avoided, and there is almost no increase in the size of the circuit or increase in the area. Furthermore, the low noise and the high performance can be realized with almost no increase in the current consumption. Applying to the continuous time system, as well as applying to the discrete time system (sampling data system) is also possible.

Although the operational amplifiers (amplifier circuits) are described as the embodiments of this invention, the circuit structure of this invention is not limited to them. Any semiconductor integrated circuit is included within the scope of this invention as long as it includes the MOS transistor having the thick gate oxide film and the MOS transistor having the thin gate oxide film and is provided with a protection circuit to protect the MOS transistor having the thin gate oxide film from overvoltage and operates with the power supply voltage for the MOS transistor having the thick gate oxide film, while the MOS transistor having the thin gate oxide film is used in the circuit portion in which the circuit operation is substantially affected by the noise.

With the semiconductor integrated circuit of this invention, in the circuit structured including the MOS transistors having the thick gate oxide film, the noise level can be efficiently reduced by using the MOS transistors having the thin gate oxide film in the circuit portion in which the circuit operation is substantially affected by the noise. Also, even when the power supply voltage used corresponding to the MOS transistor having the thick gate oxide film is supplied to the circuit, it can operate without applying the excessive voltage to the MOS transistor having the thin gate oxide film by adding the protection circuit. In addition, since the power supply voltage corresponding to the MOS transistor having the thick gate oxide film is used, reduction in the workable level of signal can be suppressed to the minimum and the high performance is realized.

Also, substantial increase in the circuit for the chopper modulation technique or the like and extreme increase in the area for the noise reduction can be avoided, and there is almost no increase in the size of the circuit or increase in the area. Furthermore, the low noise and the high performance can be realized with almost no increase in the current consumption.

The semiconductor integrated circuit of this invention can be applied not only to the continuous time system but also to the discrete time system (sampling data system).

What is claimed is:

1. A semiconductor integrated circuit comprising:
a circuit comprising a transistor having a thick gate oxide film, a transistor having a thin gate oxide film, a differential amplifier circuit comprising first and second differential input transistors, a first current source transistor having a thin gate oxide film, and a second current source transistor having a thin gate oxide film, wherein the transistor having the thin gate oxide film being configured to operate in a portion of the circuit which is substantially affected by noise, and the thick gate oxide film being thicker than the thin gate oxide film;
a protection circuit disposed in the circuit and configured to protect the transistor having the thin gate oxide film from overvoltage, the protection circuit comprising a first protection transistor having a thick gate oxide film and a second protection transistor having a thick gate oxide film, wherein the first protection transistor is connected in series with the first differential input transistor and configured to protect the first differential input transistor from overvoltage, the second protection transistor is connected in series with the second differential input transistor and configured to protect the second differential input transistor from overvoltage; and
a bias circuit configured to apply a common bias voltage to gates of the first and second protection transistors,
wherein the circuit is configured to receive a power supply voltage corresponding to the transistor having the thick gate oxide film,
and wherein the first current source transistor is connected with the first differential input transistor in series through the first protection transistor, the second current source transistor is connected with the second differential input transistor in series through the second protection transistor.

2. The semiconductor integrated circuit of claim 1, wherein the protection circuit further comprises a third protection transistor having a thick gate oxide film and a fourth protection transistor having a thick gate oxide film, the third protection transistor being connected with the first current source transistor in series and configured to protect the first current source transistor from overvoltage, the fourth protection transistor being connected with the second current source transistor in series and configured to protect the second current source transistor from overvoltage.

3. The semiconductor integrated circuit of claim 2, wherein the bias circuit is further configured to apply another common bias voltage to gates of the third and fourth protection transistors.

4. The semiconductor integrated circuit of claim 1, wherein the circuit comprises an output transistor having a thin gate oxide film and a load transistor having a thick gate oxide film, a differential output voltage from the differential amplifier circuit being configured to apply to a gate of the output transistor, the load transistor being connected with the output transistor in series, and wherein the protection circuit comprises a fifth protection transistor having a thick gate oxide film, the fifth protection transistor being connected with the output transistor in series and configured to protect the output transistor from overvoltage.

5. The semiconductor integrated circuit of claim 1, wherein a back gate of the first differential input transistor is connected with a source of the first differential input transistor and a back gate of the second differential input transistor is connected with a source of the second differential input transistor.

6. The semiconductor integrated circuit of claim 1, wherein the power supply voltage corresponding to the transistor having the thick gate oxide film is high enough to exceed a maximum allowable voltage for the transistor having the thin gate oxide film.

7. The semiconductor integrated circuit of claim 1, wherein the circuit further comprises a power supply transistor having a source connected to the power supply voltage and a drain connected to a common source of the first and second differential input transistors.

8. The semiconductor integrated circuit of claim 4, wherein the circuit further comprises a power supply transistor having a source connected to the power supply voltage and a drain connected to a common source of the first and second differential input transistors, and wherein the bias circuit is further configured to apply another common bias voltage to gates of the load and power supply transistors.

9. The semiconductor integrated circuit of claim 1, wherein both the first and second differential input transistors are P-channel type MOS transistors having a thin gate oxide film.

10. The semiconductor integrated circuit of claim 1, wherein both the first and second differential input transistors are N-channel type MOS transistors.

11. The semiconductor integrated circuit of claim 1, wherein the gates of the first and second current source transistor are connected with each other and together connected to a drain of the first current source transistor.

12. The semiconductor integrated circuit of claim 2, wherein the gates of the first and second current source transistor are connected with each other and together connected to a drain of the third protection transistor.

13. A semiconductor integrated circuit comprising:
a circuit comprising a transistor having a thick gate oxide film, a transistor having a thin gate oxide film, and a first and second differential input transistors, the transistor having the thin gate oxide film being configured to operate in a portion of the circuit which is substantially affected by noise and the thick gate oxide film being thicker than the thin gate oxide film; and
a protection circuit disposed in the circuit and protecting the transistor having the thin gate oxide film from overvoltage, wherein the protection circuit comprises a first resistor and a second resistor, the first resistor being connected in series with the first differential input transistor and protecting the first differential input transistor from overvoltage, the second resistor being connected in series with the second differential input transistor and protecting the second differential input transistor from overvoltage,
wherein the circuit is configured to receive a power supply voltage corresponding to the transistor having the thick gate oxide film.

14. The semiconductor integrated circuit of claim 13, wherein the first and second differential input transistors are N-channel type MOS transistors having a thin gate oxide film.

15. The semiconductor integrated circuit of claim 13, wherein the power supply voltage corresponding to the transistor having the thick gate oxide film is high enough to exceed a maximum allowable voltage for the transistor having the thin gate oxide film.

16. A semiconductor integrated circuit comprising:
a circuit comprising a transistor having a thick gate oxide film, a transistor having a thin gate oxide film, first and second differential input transistors, a first current source transistor having a thin gate oxide film and a second current source transistor having a thin gate oxide film, wherein the transistor having the thin gate oxide film is configured to operate in a portion of the circuit which is substantially affected by noise, and the thick gate oxide film being thicker than the thin gate oxide film, and wherein the first current source transistor is connected in series with the first differential input transistor, the second current source transistor is connected in series with the second differential input transistor;
a protection circuit disposed in the circuit and protecting the transistor having the thin gate oxide film from overvoltage, the protection circuit comprising a constant current source, a first protection transistor configured to protect the first current source transistor from overvoltage and a second protection transistor configured to protect the second current source transistor from overvoltage, wherein a drain of the first protection transistor is connected with the constant current source, a gate of the first protection transistor is connected with a connecting node between the first differential input transistor and the first current source transistor, a drain of the second protection transistor is connected with the constant current source, and a gate of the second protection transistor is connected with a connecting node between the second differential input transistor and the second current source transistor;
wherein the circuit is configured to receive a power supply voltage corresponding to the transistor having the thick gate oxide film.

17. The semiconductor integrated circuit of claim 16, wherein the first and second protection transistors have a thick gate oxide film.

18. The semiconductor integrated circuit of claim 16, wherein the protection circuit further comprises a third protection transistor having a thick gate oxide film and configured to protect the first differential input transistor from overvoltage, and a fourth protection transistor having a thick gate oxide film and configured to protect the second differential input transistor from overvoltage, wherein the third protection transistor is connected in series with the first differential input transistor, the fourth protection transistor is connected in series with the second differential input transistor.

19. The semiconductor integrated circuit of claim 16, wherein the first and second differential input transistors are P-channel type MOS transistors having a thick gate oxide film.

20. The semiconductor integrated circuit of claim 16, wherein the power supply voltage corresponding to the transistor having the thick gate oxide film is high enough to exceed a maximum allowable voltage for the transistor having the thin gate oxide film.

* * * * *